United States Patent

[11] 3,573,570

[72] Inventors Clyde R. Fuller
Plano;
James A. Cunningham, Dallas, Tex.
[21] Appl. No. 14,767
[22] Filed Feb. 26, 1970
[45] Patented Apr. 6, 1971
[73] Assignee Texas Instruments Incorporated
Dallas, Tex.
Continuation of application Ser. No. 715,462, Mar. 4, 1968, now abandoned.

[54] OHMIC CONTACT AND ELECTRICAL INTERCONNECTION SYSTEM FOR ELECTRONIC DEVICES
22 Claims, 12 Drawing Figs.

[52] U.S. Cl. .... 317/235, 29/590, 317/234, 117/215
[51] Int. Cl. .... H01l 3/00, H01l 5/00
[50] Field of Search .... 317/234, 235, 5, 5.2, 5.3, 5.4, 22, 101; 29/195, 578, 590; 117/215

[56] References Cited
UNITED STATES PATENTS

| | | | |
|---|---|---|---|
| 3,290,127 | 12/1966 | Kahng et al. | 317/234 |
| 3,290,570 | 12/1966 | Cunningham | 317/234 |
| 3,341,743 | 9/1967 | Ramsey | 317/234 |
| 3,341,753 | 9/1967 | Cunningham et al. | 317/234 |
| 3,382,099 | 5/1968 | Montmory | 317/234X |
| 3,419,765 | 12/1968 | Clark et al. | 317/234 |
| 3,434,020 | 3/1969 | Ruggiero | 317/234 |
| 3,435,445 | 3/1969 | Clendinning et al. | 317/234 |
| 3,442,012 | 5/1969 | Murray | 317/234 |
| 3,449,825 | 6/1969 | Loro | 317/234 |

*Primary Examiner*—James D. Kallam
*Assistant Examiner*—Andrew J. James
*Attorneys*—Samuel M. Mims, Jr., James O. Dixon, Andrew M. Hassell, Harold Levine, Melvin Sharp, Gerald B. Epstein and John E. Vandigriff

ABSTRACT: Disclosed is a tungsten ohmic contact and electrical interconnection system for semiconductor devices. Particularly, a system of one or more levels of multilayer metal interconnections for integrated circuits. The multilayer metal interconnections are composed of outer tungsten layers of metal that adhere well to silicon and silicon oxide with an intermediate layer of high conductivity metal. Different levels of multilayer metal interconnections are separated from one another by insulating layers with holes that allow ohmic contacts to be made between different levels. The final or top multilayer metal interconnections can have one adherent metal layer covered by the high conductive metal layer.

JAMES A. CUNNINGHAM
CLYDE R. FULLER
INVENTOR

BY MELVIN SHARP
ATTORNEY

OHMIC CONTACT AND ELECTRICAL INTERCONNECTION SYSTEM FOR ELECTRONIC DEVICES

This application is a continuation of Ser. No. 715,462, filed Mar. 4, 1968 and now abandoned.

The invention relates to semiconductive devices particularly of the semiconductor integrated circuit type and to the provision of alternate layers of metal films and electrical insulating material to form multilevel contact and interconnection patterns for such devices.

The increased demand of for microminiaturization has been reflected in the field of electronics by the development of semiconductor integrated circuits and Large Scale Integration devices (LSI), whereby a plurality of active and/or passive circuit components are formed in or on one or more substrates of semiconductor material, each of these circuit components thereafter being interconnected in a particular manner to provide one or more desired circuit functions. For example, an integrated circuit device of the monolithic type may have a number of active and passive components, such as transistors and resistors, formed by diffusion beneath one surface or major face of a substrate of semiconductor material, an insulating layer upon the face of the wafer, and metallic films upon the insulating layer interconnecting the resistors and the various regions of the transistors in a desired pattern through holes in the insulating layer. With increasing circuit complexity, however, and a corresponding increase in the complexity of the interconnection patterns, especially in LSI devices, it has become necessary to form more than one level of metallic film interconnections with adequate electrical isolation between the various levels at the crossover points. This is particularly true, when, upon a single substrate of semiconductor material, a plurality of separate circuits are formed and it becomes necessary to interconnect the circuits for cooperative action to produce one or more circuit functions.

In integrated circuits and particularly LSI devices where two, three or more level interconnection systems are required, the better electrical conductors such as silver, copper, gold and aluminum are used for the underlying levels (as part of the first level of a two-level system and as part of the first and second levels of a three-level system, for example) because of two fundamental reasons.

First, the thickness of the interconnection should be at a minimum so that continuous insulating layers can be applied over it. In general, particularly where inorganic insulating layers can are employed, such as RF sputtered silicon oxide, the thicker the metal interconnection is, the more difficult is the task of depositing an insulating layer of high perfection over it. It has been found that the insulating layer thickness should be equal to or greater than the underlying metal film thickness in order to obtain high insulated crossover yields. But as the insulating layer thickness increases, problems such as cracking, crazing and severe undercutting upon etching the feed-through holes increase markedly.

Secondly, the metal interconnection thickness should be at a maximum to provide low sheet resistivity. Values of sheet resistivity as low as 0.01 ohms/square are needed in some logic circuits. Attempts to use a single metal other than the high conductivity metals, such as gold and aluminum, for example, on logic integrated circuits and on LSI devices have generally been abandoned because the thickness necessary to obtain very low sheet resistivity is so great that the thick interconnection is prohibitively difficult to etch into a precision pattern and is difficult to insulate from upper levels and tends to easily delaminate. The problem of sheet resistivity does not arise in single-level nonexpanded contacts, such as contacts to mesa diodes and "ring and dot" transistors because currents pass through the metal film rather than along the metal film. The resistance developed perpendicularly through a thin metal film, regardless of its resistivity, is negligible due to its extreme thinness. It should be pointed out that bipolar silicon integrated circuits and LSI devices of the high-speed logic type are particularly sensitive to the resistivity of the interconnection metal since such devices operate at relatively high currents.

Obviously these two fundamental requirements are incompatible unless very high conductivity interconnections are used, and, thus, a solution to the problem lies only in the use of high conductivity metals, such as silver, copper, gold and aluminum, for example, which have the following resistivities at 20° C.:

Silver—$1.6\times10^{-6}\Omega$-cm.
Copper—$1.67\times10^{-6}\Omega$-cm.
Gold—$2.3\times10^{-6}\Omega$-cm.
Aluminum—$2.69\times10^{-6}\Omega$-cm.

Since silver, copper, and gold exhibit low adhesion to appropriate insulating layers, such as silicon oxide, which is commonly used on integrated circuits, such metals can be considered only when used in conjunction with other metals in the form of bimetal or trimetal films.

For the high conductivity metal layer, gold is highly desirable because of its unique properties of oxidation and stain resistance combined with high electrical conductivity. The metals copper, silver, aluminum, although highly conductive, present problems of oxidation, staining and even chemical attack during the etching of the feed-through holes in the insulating layers. Thus, low-resistance feed-through contacts are difficult to provide with metals other than gold. Silver oxidizes and stains in air at room temperature and consequently presents an ohmic contact problem. Aluminum particularly troublesome, being thermodynamically unstable with silicon oxide, a characteristic which commonly results in difficult-to-remove forms of glass and oxides which form at the aluminum-silicon oxide interface, resulting in the formation of insoluble aluminum oxide.

Another desired property of the high conductivity metals, just mentioned, is a low activation energy of self diffusion, according to the following formula:

$D=Ae^{1Q/RT}$ where:

$Q$=Activation energy of self diffusion in Kcal./mole
$A$=frequency factor in cm.$^2$/sec.
$D$=diffusion coefficient for self diffusion in cm.$^2$/sec.
$R$=1.987 cal./mole/°K.
$T$=temperature in °K.

which results in the following ranking:

Copper—48 Kcal./mole
Silver—44 Kcal./mole
Gold—42 Kcal./mole
Aluminum—34 Kcal./mole The activation energy becomes important at high-current levels due to the characteristic of a metal with a low activation energy to form an open circuit upon the application of high currents. Copper is thus the best metal to use from a high-current view point and aluminum the worst. In fact, aluminum is not used for modern very high-current density devices.

Since the requirement of low sheet resistivity is so severe, only those pairs of metals which are metallurgically stable can be used. A metallurgical stable bimetal film system is defined as one in which no intermetallic compounds can form, very low mutual solid solubilities exist, and eutectic temperatures (if any are considerably above all devices process temperatures. A variety of phenomena occur upon the heating of an unstable bimetal or trimetal layer. As the metals mix together by interdiffusion, a significant increase in resistivity occurs as the more conductive metal becomes contaminated. Other dileterious effects include such things as swelling, peeling, blistering and more subtle phenomena, such as Kirkendall porosity.

The second metal used in a bimetal or trimetal interconnection system, in addition to being metallurgically stable with the high conductivity metal, must adhere well to different oxides and glass insulations and should provide good ohmic contact to the silicon substrate. Such a second metal in common use today for interconnections is molybdenum, as more fully described in U.S. Pat. No. 3,290,570, and assigned to the assignee of he present application. Molybdenum, with gold, forms a good interconnection system for use with integrated circuits.

However, there is a problem inherent in the molybdenum-gold-molybdenum interconnection system when used with the conventional silicon oxide insulating layer between levels of interconnections. The holes formed in the silicon oxide layer to allow ohmic connections to be made between levels of interconnection tend to have "bell bottom" contoured sides, i.e., large at the bottom of the hole and small at the top. Due to the overhang of the side of the hole, because of its "bell bottom" shape, a continuous connection from the metal interconnection on the top surface of the silicon oxide layer to the surface of the lower metal interconnection exposed by the hole is difficult to achieve.

In addition, molybdenum forms a number of easily soluble oxides. During the etching of the hole in the silicon oxide layer to expose the lower metal interconnection, the molybdenum oxide at the molybdenum-silicon oxide interface is easily attacked by the etch solution, resulting in severe undercutting The undercutting can be so deep that the loosened bond between the silicon oxide layer and the oxidized surface of the molybdenum film of the lower interconnection allows the undercut portion of the silicon oxide layer to loosen and break off from the rest of the silicon oxide layer, resulting in an open connection.

The insulating material between levels of metal interconnections should afford adequate electrical isolation and should be substantially free of pinholes to avoid the possibility of electrical shorting between levels. In addition, the entire system should be fabricated from metals and insulators or oxides which are structurally reliable materials that will not yield or break up during substrate handling. All the material should be physically and chemically stable when subjected to high temperatures so that none of the materials will undesirably react with one another or with the semiconductor substrate. The metals and the isolation or insulation medium should tightly adhere to one another and there should be good (interlevel) ohmic contact between the last or exposed metal film of one level and the first metal film at the next level at conductive crosspoints.

In view of the above, an object of the present invention, therefore, is a new and improved contact and multilevel interconnection system for semiconductor integrated circuits and Large Scale Integration devices.

Another object of the invention is a contact and multilevel interconnection system that possesses all or substantially all of the above-mentioned desired characteristics.

Yet another object of the invention is expanded contacts and/or a multilevel interconnection system with feed-through holes in the insulating layer that do not have "bell bottom" shapes.

Still another object of the invention is a contact and multilevel interconnection system that does not suffer from substantial metal-insulating layer interface attack during the formation of feed-through holes in the insulating layer covering a level of metal interconnections.

Still yet another object of the invention is an improved expanded contact for semiconductor devices and particularly for devices incorporated into nonhermetic enclosures.

The novel features believed characteristic of this invention are set forth in the appended claims. The invention itself, however, as well as other objects and advantages thereof may best be understood by reference to the following detailed description when read in conjunction with the accompanying drawings, wherein:

Figure 3:
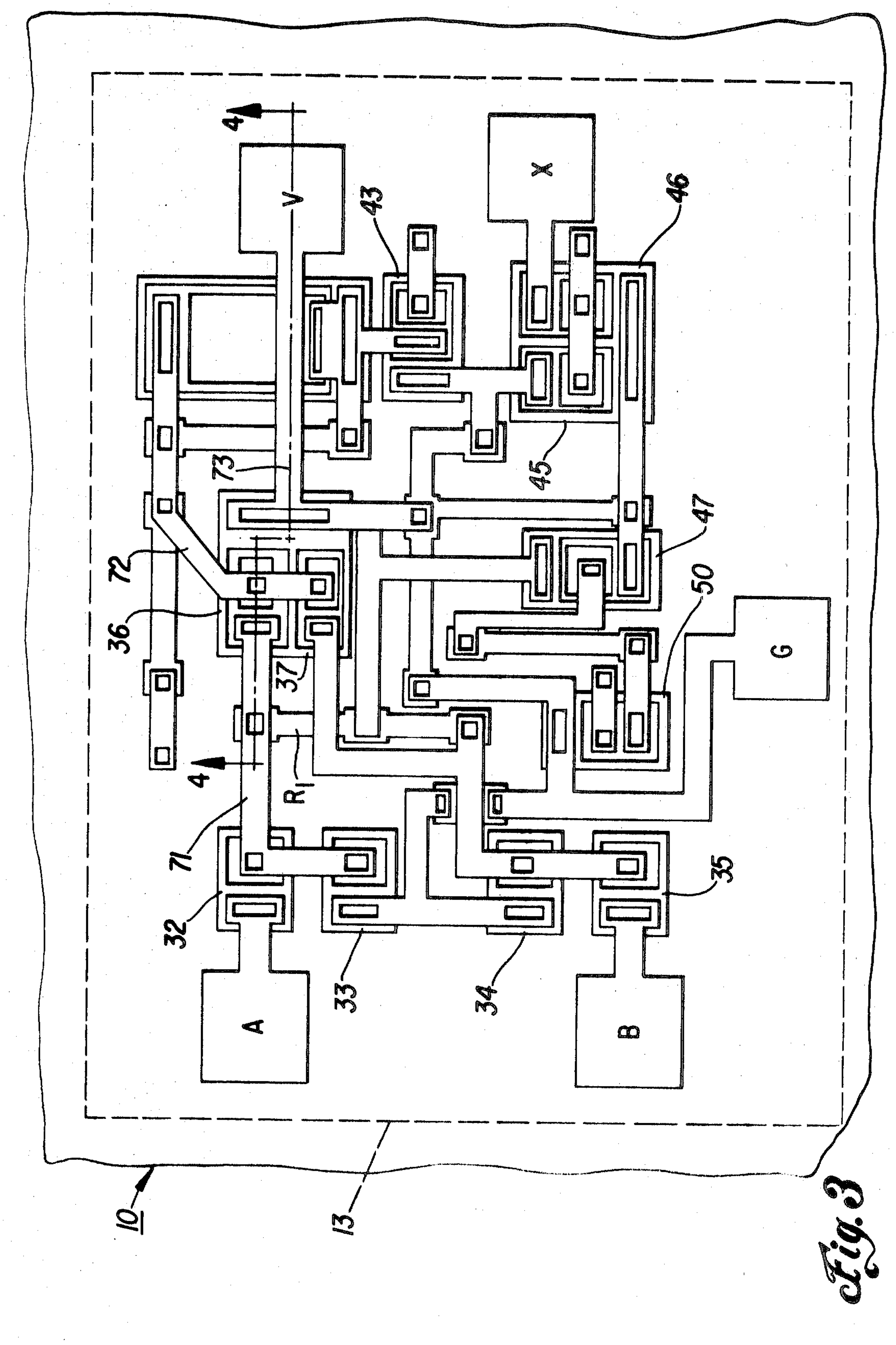
FIG. 3 is a plan view, illustrating the layout of circuit components in one of the functional elements in the substrate shown in FIG. 4, the same components being illustrated in schematic form in FIG. 5.
Figure 10:
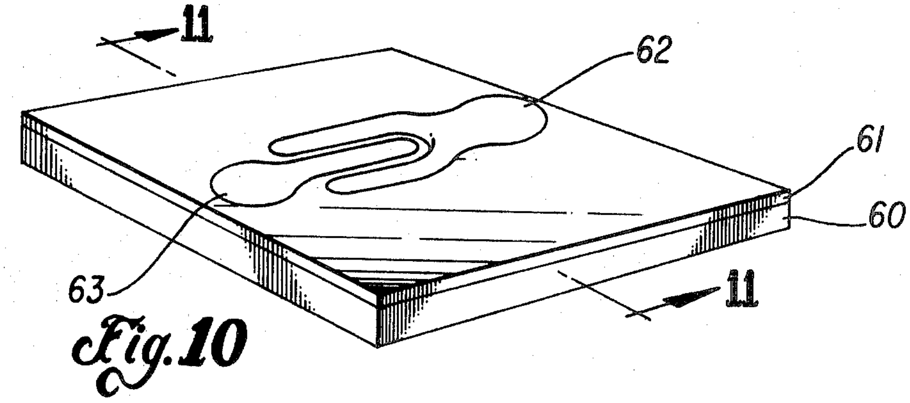
Figure 11:
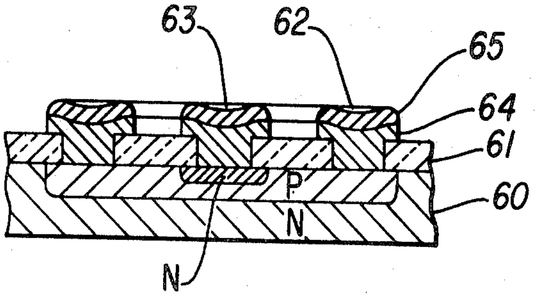

FIGS. 6—9 are sectional views of a portion of the integrated circuit structure shown in FIG. 3 taken along the sectional line 4—4, illustrating subsequent steps in the fabrication of the multilevel interconnection system of the present invention;

FIG. 10 is a plan view, illustrating a discrete semiconductor device according to the invention; and FIG. 11 is sectional view taken along the line A–A of FIG. 10.

One embodiment of the invention comprises a multilevel interconnection system using trimetal interconnections of tungsten-high conductivity metal-tungsten, each metal level being separated from other metal levels by insulating layers. Ohmic contacts between one level of interconnections and another level or between a level of interconnections and portions of a semiconductor substrate having electronic components are made through holes in the insulating layers.

A completely unexpected result obtained by using tungsten-high conductivity metal-tungsten multilevel interconnections rather than molybdenum-gold-molybdenum multilevel interconnections with isolation between levels by insulating layers such as silicon oxide is the improvement of the slope or contour of the sides of the feed-through holes formed in the silicon oxide layers. If the contour of the sides of the hole in a silicon oxide layer becomes very short, that is, approximately perpendicular to the plane of the device surface difficulties are encountered in continuously metallizing from the upper silicon oxide surface, difficulties down the hole slope and onto the lower level metal interconnection. This situation becomes worse when a hole contour with a reverse slope, forming a "bell bottom" shaped feed-through hole, is encountered, as shown in FIG. 1, such a contour being commonly observed.

The reason for the reverse sloped side 100 of the "bell bottom" hole 101 which is formed during the hole etching step in the silicon oxide layer 102 is not fully understood. However, the shape of the hole 101 is probably related to some characteristic of the molybdenum film 103, as of now unknown, which forms the upper film of the lower interconnection along with the intermediate gold film 104 and the lower molybdenum film 105 formed on the silicon substrate 106.

Figure 2:
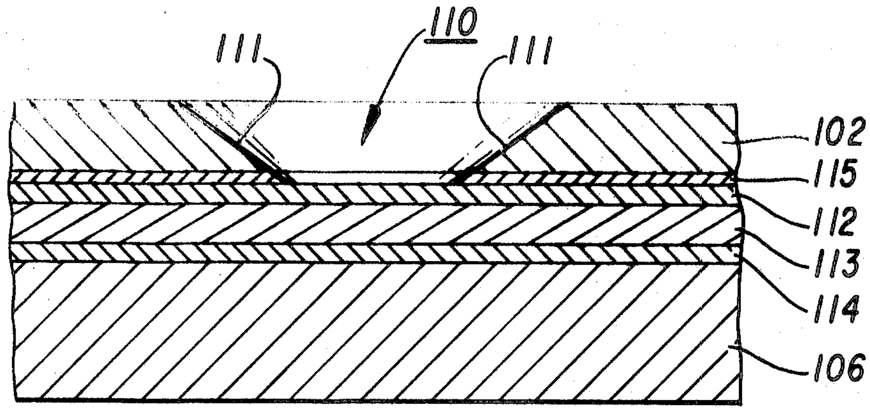
FIG. 2 is a sectional view, greatly enlarged, illustrating a feed-through hole having gently sloped sides in the insulating layer between different levels of interconnections with the metal interconnection system of the invention.

When tungsten is used rather than molybdenum, the feed-through hole 110, as shown in FIG. 2, has, completely unexpectedly the gently sloped side 111, of about 20° to 40°, which is actually better than even the upper limit of the "desired" slope of 45°. It is obvious from FIG. 2 that a second level of interconnection can be formed on the top surface of the silicon oxide layer 102 and on the gently sloped side 111 of the hole 110 to make electrical contact to the lower interconnection, consisting of the upper tungsten film 112, the intermediate gold film 113 and the lower tungsten film 114, without any danger of a break or opening in the contact.

Figure 1:
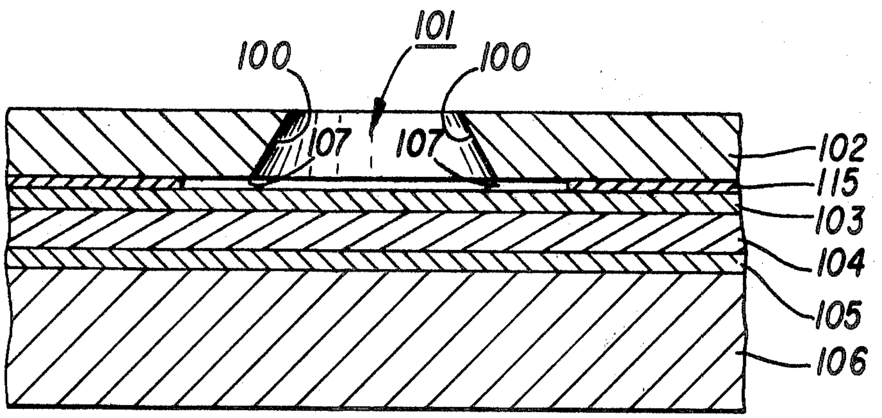
FIG. 1 is a sectional view, greatly enlarged, illustrating a "bell bottom" feed-through hole in the insulating layer between different levels of interconnections with a molybdenum-gold-molybdenum interconnection system.

Another unexpected advantage of using tungsten rather than molybdenum is the elimination of the undercutting 107 at the molybdenum-silicon oxide interface, as shown in FIG. 1, when the feed-through hole 11 is formed. The undercutting rate with molybdenum oxide 115 FIG. 1 is faster than is predicted from the ability of an etching solution to react and remove reaction products along a 4–5 microinch channel, the approximate thickness of the molybdenum oxide at the silicon oxide-molybdenum interface. Unless very carefully controlled, the molybdenum undercutting can proceed several mils and in some instances, the oxide layer can "pop up" around the undercut area resulting in magnifying the "bell bottom" hole problem. It is also suspected that occasionally during the hole formation the silicon oxide layer 102 can break its bond with the molybdenum layer 103 at the lower periphery of the hole, resulting in etching of the silicon oxide near the molybdenum-silicon oxide interface, again resulting in a hole with a badly shaped contour.

Regardless of the physical or chemical mechanisms involved, the undercutting and "bell bottom" shaped hole effects are absent in the tungsten-silicon oxide system as can be seen from FIG. 2. There is no substantial undercutting of the tungsten oxide 115 FIG. 2 at the tungsten-silicon oxide interface. Neither the absence of the "bell bottom" shape of the hole nor the absence of harmful undercutting of the tungsten-silicon oxide interface can be explained by comparing any of the known properties of molybdenum and tungsten. The use of tungsten permits the fabrication of devices with extremely complex circuitries that cannot be made today using molybdenum with any substantial success.

Tungsten makes good ohmic contact to silicon, particularly if the contact regions are heavily doped, yet does not undesirably alloy with the silicon surface so as to degrade the device. Furthermore, the tungsten adheres well to silicon oxide, can be etched in a controlled manner with an etchant, for example, an aqueous solution of 5 percent Potassium Ferri Anide $K_3Fe(CN)_6$ and 1 percent Sodium Borate $Na_2B_4O_7 \cdot 10H_2O$, compatible with other materials, and when used in combination with gold, is virtually impervious to the gold. In this regard, it is to be noted that when tungsten is formed contacting the silicon semiconductor with a gold layer on the tungsten, a virtually "alloyless" contact system is formed, the tungsten not alloying with the silicon and the old gold not alloying with the tungsten.

Gold, in addition to its excellent conductivity, is easily deposited by conventional evaporation techniques, lends itself nicely to photoresist etching procedures associated with defining the contact and interconnection patterns, and is easily bonded with gold lead wires.

In applications where extremely high currents are used, a better device is achieved by replacing the gold film with a copper film Although more care in interconnection fabrication must be taken to reduce the danger of the copper oxidizing or being attacked by the etches used indifferent stages of device fabrication, the use of copper rather than gold is necessitated by high current devices which require the better conductivity and lower activation energy of diffusion of copper for lower resistivity interconnections.

Figure 4:
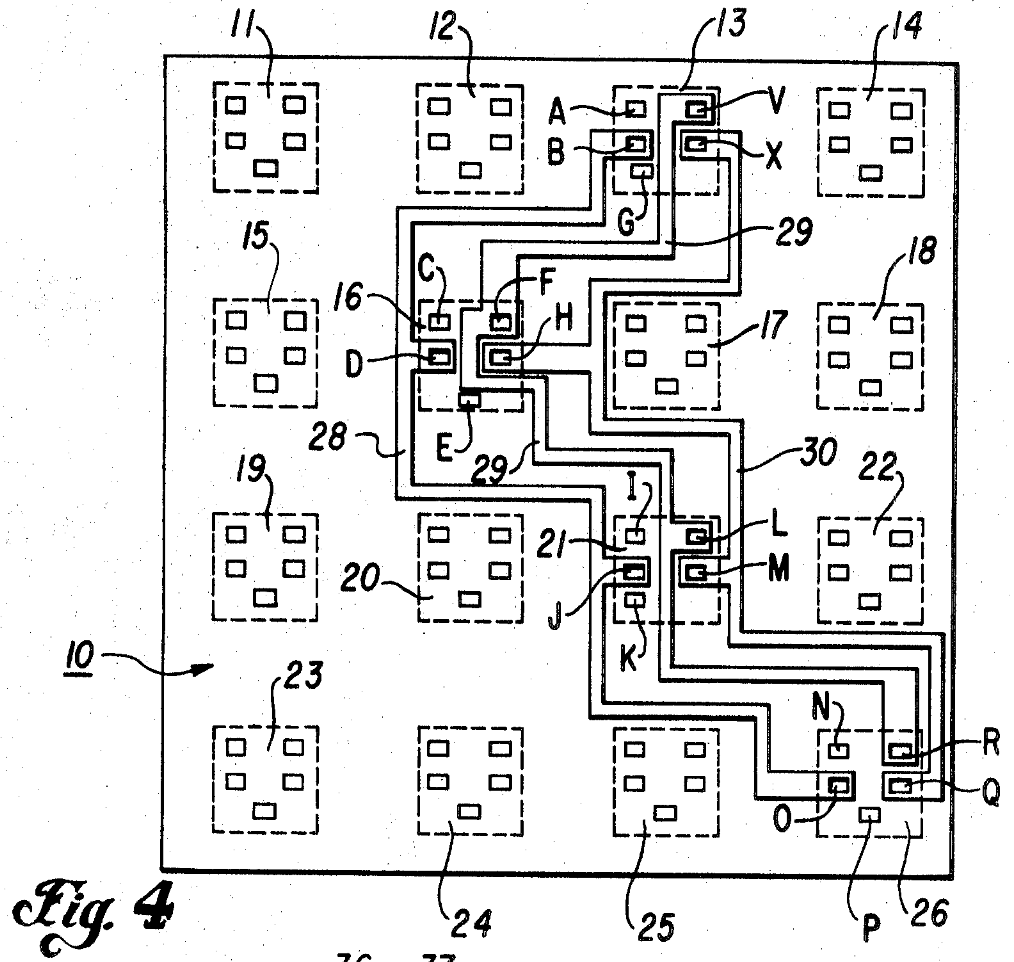
FIG. 4 is a plan view, illustrating a semiconductor substrate containing a plurality of functional elements and adapted for use in practicing this invention.

Referring now to the FIGS. a slice or substrate 10 of semiconductor material, in this case silicon semiconductor material, is illustrated in FIG. 4 having a number of functional elements therein. Although only sixteen such functional elements are shown for illustration, ordinarily a much larger number is utilized. Each of the functional elements 11-26 contains the necessary number of transistors, resistors, capacitors or the like, interconnected to produce a desired electrical circuit function. For example, the functional element 13 may comprise the circuit shown schematically in FIG. 5 and by plan view in FIG. 3. The circuit of this functional element 13 includes the PNP transistors 32, 33, 34 and 35 and the NPN transistors 36, 37, 43, 45 46, 47 and 50, the three input terminals A, B, and X and an output terminal G. These terminals, along with the voltage supply terminal V, correspond to the five identically designated terminals on the functional element 13 in FIG. 3.

Figure 5:
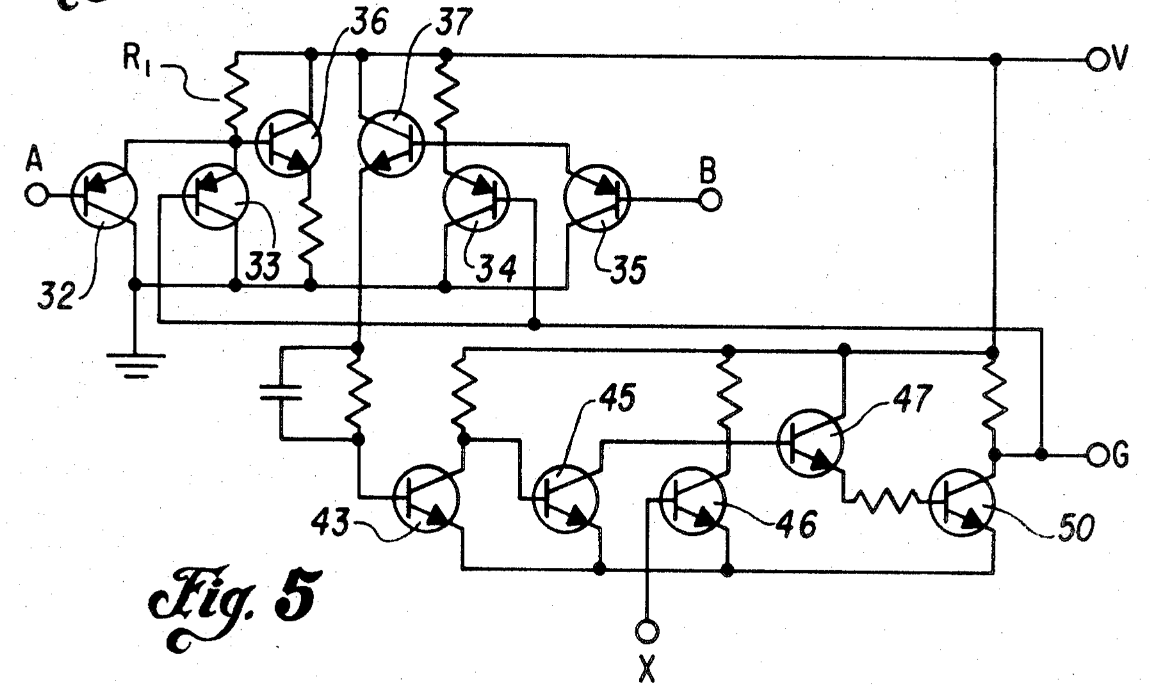
FIG. 5 is a schematic diagram of the electronic circuit in one of the functional elements shown in FIG. 3.

If it is desired to appropriately interconnect the four functional elements 13, 16, 21 and 26 of the sixteen functional elements 11—26 for their cooperative action to produce a unitary electrical function, as depicted in FIG. 4 the terminals B, D, J, and O of functional elements 13, 16, 21 and 26, respectively, are electrically joined by the interconnector 28. Similarly, the terminals V, F, L and R are electrically joined by the interconnector 29, and the terminals X, H, M and Q are electrically joined by the interconnector 30. Recognizing that there are already a large number of the first level electrical interconnections joining the various transistors with one another as well as with the other circuit components and terminals, as shown in FIG. 5, it will be appreciated that the interconnectors 28, 29 and 30 must necessarily overlie some of the first level metal interconnection pattern shown in FIG. 3. For this reason, and s also because the interconnections between functional elements are preferably made in an operation separate from the one by which the interconnections within an element are formed, the interconnection pattern of FIG. 4 is formed as a second level, separated from the first level interconnection pattern by an insulating medium.

The transistors and the other circuit components may be formed within or upon the semiconductor substrate 10 by any of the techniques known in the integrated circuit art such as, for example growth or diffusion. Thus, looking at FIG. 6 there is depicted, in section, a portion of the integrated circuit structure of FIG. 5 before the application of any of the metal interconnectors. The NPN transistor 36 comprises an N-type collector formed by the substrate 10, the diffused P-type base region 51, and an N-type diffused emitter region 52. The resistor $R_1$ is provided by the P-type diffused region 53, formed simultaneously with the base region 51 of the transistor. An insulating layer 54 on the top surface of the substrate acquires stepped configuration, as shown due to the successive diffusion operations. Thereafter apertures or holes are cut in the insulating layer 54 where the first level interconnection ohmic contacts are to be made.

As the next step, a thin tungsten film 55 of about 10 microinches is deposited upon the surface of the insulating layer 54 and in ohmic contact with the semiconductor material, such as silicon, within the holes in the silicon oxide layer. Various techniques may be utilized for the deposition of the tungsten film 55, for example, electron beam evaporation and DC and RF sputtering. If a device requires only one level of interconnections such as a less complex integrated circuit or a single component device, a gold film (not shown) is formed on at least a portion of the tungsten film for lead wire connection purposes to prevent oxidation of the tungsten, if required. Expanded contacts are then defined from the tungsten and gold films, instead of the tungsten only, contacts 71, 72 and 73 of FIG. 7, to permit lead wire bonding away from any junctions. Using conventional photographic masking and etching techniques which do not need to be described here, selected portions of the tungsten film 55 are removed to provide the first level pattern of ohmic contacts and interconnections, the interconnector 71 ohmically connecting the base of the transistor 36 to one end of the resistor $R$ 1, the interconnector 72 making ohmic contact to the emitter of the transistor 36; while the interconnector 73 ohmically connects the collector of the transistor 36 to the supply terminal V as illustrated in FIG. 7.

Figures 6, 7, 8, 9A, 9B:
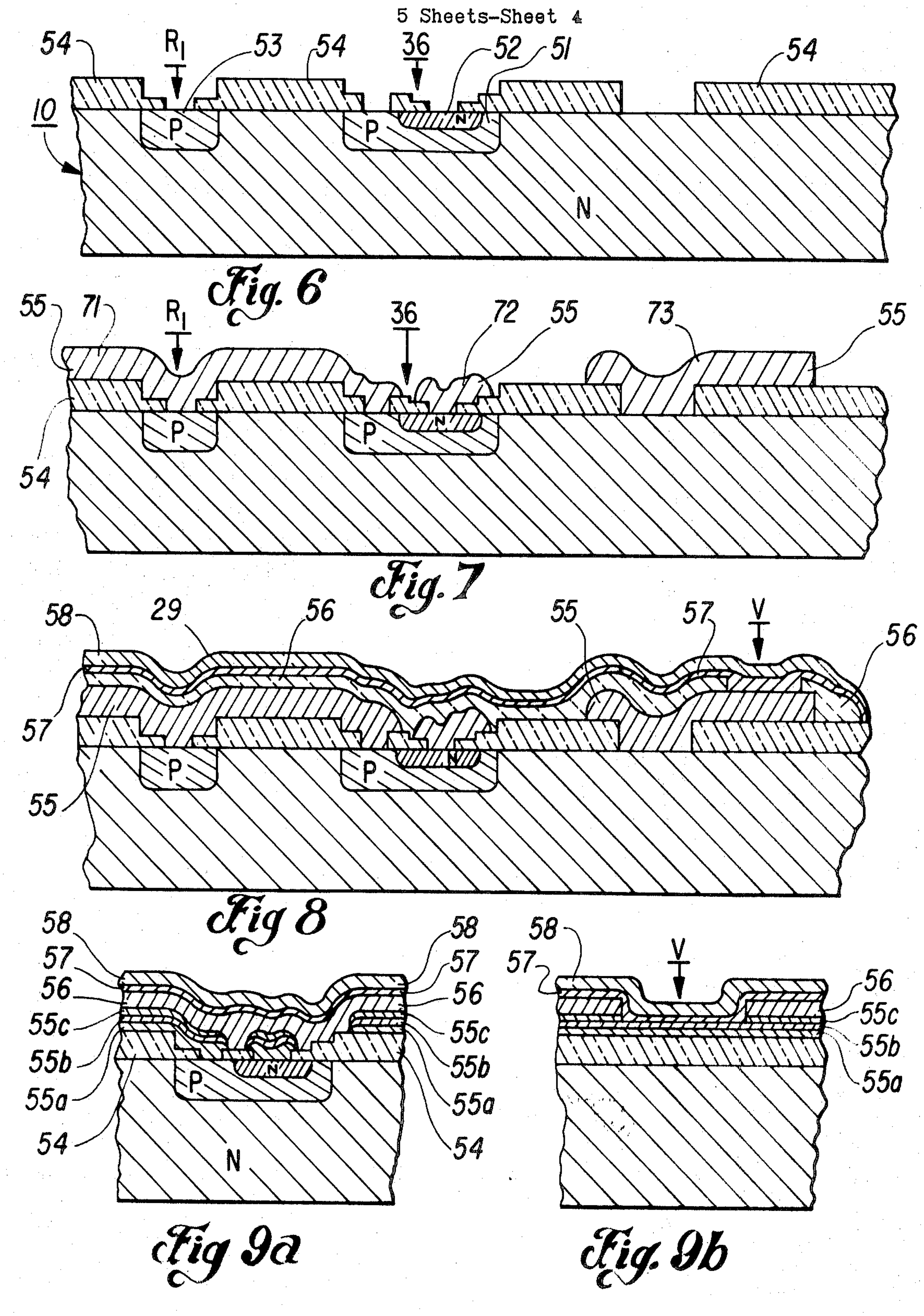

An insulating layer 56 is deposited by any suitable technique, for example, evaporation or sputtering over the tungsten film 55 and then selectively etched to expose the surface of the tungsten film solely at the terminal point V, as depicted in FIG. 8. The purpose of the insulating layer 56 is to electrically isolate the first level metal interconnections 55 from the second level metal interconnections which are to be subsequently formed. Accordingly, the layer 56 may be formed of inorganic materials such as silicon nitride, aluminum oxide silicon oxide or various organic insulating materials. In this particular example, the insulating layer 56 is silicon oxide, deposited by RF sputtering to a thickness of about 10,000A. The layer is then selectively removed by conventional techniques well known in the semiconductor industry to expose the top surface of the tungsten film 55 at the bonding pad V.

Another tungsten film 57 is deposited up the insulating layer 56 to a thickness of about 1,200 A., followed by the deposition by evaporation, for example, of a gold film 58, formed to a thickness of approximately 7,500 A., for example. The metal films 57 and 58 are then selectively etched to provide the pattern for the second level interconnections 29, interlevel contact being provided at the bonding pad V between the tungsten films 57 and 55. The gold is easily removed by etching in an alcoholic $KI_3$ solution while the tungsten is removed by etching in a basic solution of potassium ferricyanide. Typically, a 5 microinch thickness of tungsten is removed in 1 to 2 minutes with negligible undercutting of the metal. The top film 58 of gold adheres well to the tungsten film 57. An external bonding wire of gold, for example, may then be bonded by thermal compression bonding to the gold film 58. Among the advantages of this system, as illustrated in FIG. 5, is the extremely good adherence of the tungsten films 55 and 57 to the insulating layer 56. If a three, four or higher level (to the *n*th level) contact and interconnection system levels are needed, each of the levels besides the final one could be of pure tungsten with the final level being tungsten-gold combination, the overlying layer of gold facilitating bonding with an external wire. If it is desired to connect a lead wire directly to a lower level tungsten interconnector, a layer of gold can be formed only on a portion of the tungsten exposed by a hole in the overlying insulating layer so that a gold wire can be bonded to the limited gold area.

The single layer of tungsten of the first level interconnection pattern 71, 72 and 73 may be replaced with a three-layer sandwich structure, as shown in FIGS. 9A and 9B. Such a structure comprises a lower tungsten film **55*a*, formed to a thickness of about about 10 microinches, for example, ohmically engaging the semiconductor material 10 and overlying and adhering the protective insulating layer 54; an intermediate gold film 55*b* deposited on the lower etched film 55*a* to a thickness of about 50 microinches, for example, and an upper tungsten film 55*c* deposited on the gold film 55*b* to a thickness of about 5 microinches, for example. The tungsten-gold structure just described has a sheet resistivity of about 0.03 ohm/square. The final level of metallization overlying the insulating medium 56 then comprises the tungsten film 57 and the old film 58, as previously described with respect to FIG. 8. The insulating layer 56 and the tungsten layer 55*c* are selectively etched at the bonding pad v to allow the tungsten layer 57 to make direct ohmic contact to the gold film 55*b*. By utilizing the etchant that selectively etches tungsten but substantially unaffects gold, for example, the etchant previously described, it is possible to carefully control the selective removal step at the bonding pad V so that the gold layer 55 is not etched all the way through. In addition, a color change accompanies this etching operation (from a silver color to a gold color) and provides a convenient visual control over the etching. The tungsten films 55*c* and 57 tightly adhere to the insulating layer 56 and increases the inner adhesion of the entire multilevel interconnection system. The replacement of the single tungsten film 55 by the trimetal sandwich structure, tungsten-gold-tungsten, increases electrical conductivity to the first level interconnection due to the addition of the highly conductive gold film 55*b*, and decreases the interlevel electrical contact resistance between the first and second levels due to the direct ohmic contact between the tungsten film 57 of the second level interconnection to the expose surface portion of the gold film 55*b*** of the first level. As explained previously, the tungsten-gold-tungsten multilevel interconnection system is used for devices that require the low interconnection resistivity which a single tungsten film only cannot furnish.

It is obvious that for Large Scale Integration devices involving very complex circuitries the interconnection system as previously explained for a two level system can be expanded to any number of levels of interconnections by just repeating the sequence of insulating layer 54, tungsten film **55*a*, gold film 55*b* and tungsten film 55*c*** *n* number of times to accommodate the most complex circuitries. The final or upper metal interconnections would normally be the tungsten film 57, at least partially covered by the gold film 58 as shown in FIG. **9*a*. As explained previously, for devices requiring very high-current levels a more reliable interconnection system is obtained by substituting a copper film for the gold film 55*b*, as shown in FIGS. 9*a* and 9*b*. Because of copper's propensity to oxidize and interfere with the bonding of gold wires to the upper metal film 58, for most devices, gold remains as the preferred metal for the top or final metal film 58** which is exposed to the ambient. The other metal films remain at least substantially covered by overlying materials, of course.

It is to be understood that the metal, tungsten in the description and claims includes tungsten having other constituents that may enhance the characteristics of the tungsten without adversely affecting the advantageous properties of tungsten according to the invention as previously described. For example, although the tungsten film forms a good ohmic contact with a silicon surface, especially if the substrate portion beneath the ohmic contact has been highly doped with impurity modifiers, the resistance of the silicon-tungsten contact can be lowered further, if desired, by forming a thin layer of platinum silicide or using a very thin film or "flash" of aluminum or titanium ( $\approx$ 200 A. in thickness) between the tungsten and the silicon surface. In the latter case, the aluminum reacts with the tungsten forming tungsten aluminum compounds so, for this reason, the thickness of the aluminum must be quite limited so that it does not penetrate the tungsten layer and spoil its gold barrier qualities. It is pointed out that these techniques for improving the silicon-metal contact resistance do not necessarily change the basic metallurgical characteristics of the system, but increases in film adhesion are common by providing the thin film or "flash" of aluminum or titanium as a precoating. Since the metals, aluminum, titanium and tungsten are easily oxidized in air, the system can be applied successfully from multisource film deposition equipment, well known in the industry, which allows the deposition of each metal layer sequentially without breaking the vacuum of the system. Breaking the vacuum between the deposition of the different films (particularly between the aluminum "flash" and the first tungsten film) results in low adhesion and/or higher resistance contacts.

While the embodiments and processes of the present invention have been directed toward integrated circuits and the application of multilevel interconnections to these integrated circuits, the processes and structures described above may have other applications such as in the areas of discrete components, hybrid integrated circuits or in the fabrication of thin film capacitors, whenever it is desired to provide alternating layers or films of metal and electrical insulating material.

For example, FIGS. 10 and 11 illustrate a discrete NPN silicon transistor according to the invention. The P-type base zone and the N-type emitter zone are diffused into the N-type collector substrate 60 with the collector base junction and the base emitter junction terminating beneath the insulating layer 61. The expanded contacts 62 and 63 comprised of tungsten 64 and gold 65 are provided on and adherent to the insulator 61 and in ohmic contact with the base and emitter zones of the transistor as previously described. Due to the advantageous corrosion resistance characteristics of the tungsten expanded contact, a semiconductor device such as that illustrated in FIGS. 10 and 11 is especially suitable for incorporation into a nonhermetic enclosure such as the plastic encapsulation described in copending Ser. No. 331,006 entitled "Process for Encapsulating Electronic Components in Plastic" filed Dec. 16, 1963 by Birchler et al. and assigned to the assignee of the present application.

Various other modifications of the disclosed processes and embodiments will become apparent to persons skilled in the art without departing from the spirit and scope of the invention as defined by the appended claims.

We claim:

1. An electrical connection system for an integrated circuit having a plurality of circuit components formed adjacent one surface of a substrate and an insulating layer on said one surface having a plurality of holes exposing portions of said circuit components, said system comprising:

multilayer interconnections on said insulating layer electrically connecting certain portions of said circuit components through said holes in said insulating layer;

another insulating layer on said multilayer interconnections having a plurality of holes exposing portions of said multilayer interconnections;

electrical interconnections on said another insulating layer electrically connecting certain portions of said multilayer interconnections, said multilayer interconnections having a lower film comprised of tungsten;
an intermediate high-conductivity metal film; and
an upper film comprised of tungsten.

2. The electrical connection system as defined in claim 1, wherein said electrical interconnections include a lower film comprised of tungsten and an upper high conductivity metal film.

3. The electrical connection system as defined in claim 1, wherein said high-conductivity metal film is gold.

4. The electrical connection system as defined in claim 1, wherein said high-conductivity metal film is copper.

5. The electrical connection system as defined in claim 2, wherein said high-conductivity metal film of said multilayer interconnections is copper and said high-conductivity metal film of said electrical interconnections is gold.

6. An electrical connection system for an integrated circuit having a plurality of circuit components formed adjacent one surface of a semiconductor substrate, a first insulating layer or said one surface having holes exposing portions of said circuit components, said system comprising:
first multilayer interconnections on and adherent to said first insulating layer ohmically engaging and electrically interconnecting certain portions of said circuit components through said holes in said first insulating layer;
a second insulating layer on and adherent to said first multilayer interconnections having holes exposing portions of said first multilayer interconnections;
second multilayer interconnections on and adherent to said second insulating layer ohmically engaging and electrically interconnecting the exposed portions of said first multilayer interconnections, said first multilayer interconnections including a lower film comprised of tungsten;
an intermediate high-conductivity metal film; and
an upper film comprised of tungsten.

7. An electrical connection system according to claim 6, wherein said second multilayer interconnections include a lower film comprised of tungsten, and an upper high-conductivity metal film.

8. An electrical connection system according to claim 6, wherein said high-conductivity metal film is gold.

9. An electrical connection system according to claim 6, wherein said high-conductivity film is copper.

10. An electrical connection system according to claim 7, wherein said high-conductivity metal film of said first multilayer interconnections is copper and said high-conductivity metal film of said second multilayer interconnections is gold.

11. A semiconductor device comprising a metallic film ohmically contacting a semiconductor surface portion of said semiconductor device, said film comprising tungsten.

12. A semiconductor device according to claim 11, including a high-conductivity metal film on at least a portion of said metallic film.

13. A semiconductor device according to claim 11, wherein said high-conductivity film is gold.

14. A semiconductor device comprising a semiconductor substrate having first and second zones of opposite conductivity types forming a P-N junction therebetween terminating at one surface of said substrate beneath an insulating layer on said one surface, said insulating layer defining the hole therein exposing a portion of said first zone, a metallic film on and adherent to said insulating layer and ohmically connecting to the exposed portion of said first zone, said film comprising tungsten.

15. A semiconductor device according to claim 14, including a high-conductivity metal film on at least a portion of said metallic film.

16. A semiconductor device according to claim 15, wherein said semiconductor device comprises an integrated semiconductor circuit having a plurality of circuit components adjacent said one surface of said substrate, said insulating layer defines a plurality of holes exposing contact portions on said circuit components, one of which is said portion of said first zone, and said metallic film defines a plurality of strips ohmically connecting to said contact portions and electrically interconnecting said circuit components.

17. A semiconductor device according to claim 14, wherein said semiconductor substrate is silicon and said insulating layer is silicon oxide.

18. An ohmic contact for an electronic device formed adjacent one surface of a substrate comprising an insulating layer on said one surface having a hole therein exposing a contact portion on said electronic device, a metallic film on and adherent to said insulating layer and ohmically contacting said portion of said electronic device, and a high-conductive metal film on at least a portion of said metallic film, said metallic film comprising tungsten.

19. A nonhermetically enclosed semiconductor device comprising a semiconductor substrate having first and second zones of opposite conductivity types forming a P-N junction therebetween terminating at one surface of said substrate beneath an insulating layer on said one surface, said insulating layer defining an opening therein exposing a portion of said first zone, a metallic film on and adherent to said insulating layer and ohmically connecting to the exposed portion of said first zone through said opening, said film comprising tungsten.

20. A nonhermetically enclosed semiconductor device according to claim 19, including a high-conductivity metal film on at least a portion of said metallic film.

21. An electrical connection system for an integrated circuit having a plurality of circuit components formed adjacent one surface of a substrate and an insulating layer on said one surface having a plurality of holes exposing portions of said circuit components, said system comprising:
electrical interconnections on said insulating layer electrically connecting certain portions of said circuit components through said holes in said insulating layer: and
another insulating layer on said electrical interconnections having a plurality of holes exposing portions of said interconnections, electrical connections on said another insulating layer electrically contacting certain portions of said interconnections, said connections having a film comprised of tungsten.

22. An electrical connection system for an integrated circuit having a plurality of circuit components formed adjacent one surface of a substrate, a first insulating layer on said one surface having holes exposing portions of said circuit components, said system comprising:
first multilayer interconnections on and adherent to said first insulating layer ohmically engaging and electrically interconnecting certain portions of said circuit components through said holes in said insulating layer;
second insulating layer on and adherent to said first multilayer interconnections having holes exposing portions of said first multilayer interconnections, and
second multilayer interconnections on and adherent to said insulating layer ohmically engaging and electrically interconnecting the exposed portions of said first multilayer interconnections, at least a portion of said multilayer interconnections comprised of tungsten.

UNITED STATES PATENT OFFICE

CERTIFICATE OF CORRECTION

Patent No. 3,573,570 Dated April 6, 1971

Inventor(s) Clyde R. Fuller et al.

It is certified that error appears in the above-identified patent and that said Letters Patent are hereby corrected as shown below:

On the cover sheet [54] "OHMIC CONTACT AND ELECTRICAL INTERCONNECTION SYSTEM FOR ELECTRONIC DEVICES" should read -- TUNGSTEN GOLD EXPANDED CONTACT SYSTEM FOR SINGLE AND MULTILEVEL INTEGRATED CIRCUITS AND INTEGRATED CIRCUIT ARRAYS Signed and sealed this 7th day of December 1971.

(SEAL)
Attest:

EDWARD M.FLETCHER,JR.
Attesting Officer

ROBERT GOTTSCHALK
Acting Commissioner of Pat